United States Patent [19]

Mitake et al.

[11] Patent Number: 5,246,121
[45] Date of Patent: Sep. 21, 1993

[54] APPARATUS FOR CONVEYING PRESENSITIZED LITHOGRAPHIC PRINTING PLATES

[75] Inventors: Hitoshi Mitake; Kiyoshi Goto; Tamiya Matusoka, all of Hino; Keiichi Yumiki, Tokyo, all of Japan

[73] Assignee: Konica Corporation, Tokyo, Japan

[21] Appl. No.: 776,707

[22] Filed: Oct. 9, 1991

Related U.S. Application Data

[63] Continuation of Ser. No. 653,465, Feb. 8, 1991, abandoned, which is a continuation of Ser. No. 421,998, Oct. 16, 1989, abandoned.

[30] Foreign Application Priority Data

Oct. 21, 1988 [JP] Japan ............................... 63-265849

[51] Int. Cl.⁵ ............................................. A47F 7/00
[52] U.S. Cl. ......................................... 211/41; 53/447
[58] Field of Search ..................... 211/41, 50, 49.1; 108/55.1, 53.1, 51.1, 55.3, 53.3, 53.5; 280/47.17, 47.18, 47.26, 47.27, 47.28, 47.29; 410/121, 122, 123; 414/798.2, 799; 53/447

[56] References Cited

U.S. PATENT DOCUMENTS

| | | | |
|---|---|---|---|
| 1,099,933 | 6/1914 | Pohrer | 280/47.17 |
| 1,914,241 | 6/1933 | Campbell | 211/41 |
| 2,839,198 | 6/1958 | Lefevre | 211/41 |
| 2,978,270 | 4/1961 | Verheggen | 211/41 X |
| 3,003,788 | 10/1961 | Grymer | 108/55.1 X |
| 3,233,753 | 2/1966 | Rich | 211/41 X |
| 3,315,435 | 4/1967 | Gunyou | 53/447 X |
| 3,596,755 | 8/1971 | Bundy | 211/41 X |
| 3,719,284 | 3/1973 | Rasmusson et al. | 211/41 X |
| 3,759,397 | 9/1973 | De Voghel | 211/50 |
| 4,028,864 | 6/1977 | Bell | 53/447 X |
| 4,065,910 | 1/1978 | Eiselt | 53/447 X |
| 4,258,527 | 3/1981 | Steinbrecher | 53/447 |
| 4,261,626 | 4/1981 | Hornbacher | 211/50 X |
| 4,899,518 | 2/1990 | Beeman et al. | 53/447 X |

FOREIGN PATENT DOCUMENTS

| | | | |
|---|---|---|---|
| 0744560 | 7/1970 | Belgium | 211/41 |
| 8401079 | 11/1985 | Netherlands | 211/41 |

Primary Examiner—David M. Purol
Assistant Examiner—Sarah A. Lechok
Attorney, Agent, or Firm—Jordan B. Bierman

[57] ABSTRACT

The invention provides an apparatus for conveying a pile of photosensitive printing plates in which a support is covered thereon with photosensitive resin. The apparatus comprises a base plate and a pair of end plates for holding the pile of photosensitive printing plates therebetween. The pair of end plates is vertically mounted on the base plate so that the pile of photosensitive printing plates is vertically held between the pair of end plates on the base plate.

2 Claims, 6 Drawing Sheets

APPARATUS FOR CONVEYING PRESENSITIZED LITHOGRAPHIC PRINTING PLATES

This application is a continuation of application Ser. No. 07/653,465, filed Feb. 8, 1991, now abandoned, which is a continuation of Ser. No. 07/421,998 filed Oct. 16, 1989, now abandoned.

BACKGROUND OF THE INVENTION

The present invention relates to an apparatus for conveying presensitized lithographic printing plates.

Generally speaking, a presensitized lithographic printing plate has an aluminum support plate on which photosensitive resin layers are formed. The size of the presensitized lithographic printing plate is usually pretty large. To be more specific, the size of the plate is approximately 1 m × 1 m. Furthermore, its weight is 500 to 1000 g per plate.

Up to the present, when presensitized lithographic printing plates are stored or conveyed, a suitable number of plates are piled up, horizontally with interleaves inserted between each plate.

However, the use of interleaves in order to prevent damage to the printing plate surface greatly reduces working efficiency, when the printing plates are piled up and taken out from the pile.

Recently, in order to improve the situation, the apparatus shown in FIG. 9 has been adopted. In FIG. 9, the presensitized lithographic printing plates 1, 1, ... are horizontally piled without inserting interleaves and they are strongly squeezed by the rigid end plates 2, 2 which are located at both the upper side and the lower side and clamped tightly by the bolts 3, 3, .... In this way, the pile of plates becomes a solid pallet and scratches on the surfaces of the presensitized lithographic printing plates caused by slippage of the plates, created by vibration, can be prevented.

In this case, one of the end plates 2 functions as a pallet board, and a cardboard sheet 4 is put at least between one of the surfaces of a pile of the presensitized lithographic printing plates 1, 1 ... and one of end plates 2, 2 in order to prevent damage of the printing plate surfaces. The number of the plates in the pile is usually 700 to 1500 When the pile is conveyed, a forklift is used as the weight of 1000 plates is 500 to 1000 kg.

However, in the case of using the above-mentioned end plates and piling the presensitized lithographic printing plates horizontally, the first problem is the area needed to store the pile, which must be more than 1 m × 1 m. The second problem is that when 700 to 1500 printing plates are conveyed close to the plate processing machine (the developer and the printer), they are actually fed to the machine by hand. About 50 plates are put against a stand close to the plate making machine, and the photosensitive resin surfaces of the plates must be taken care of so as not to be damaged. The plates must be taken out to be used one by one from a group of plates leant against the stand. As a result, the working efficiency is low and the printing plates need to be handled carefully. Although the number of plates is about 50, their weight is pretty heavy and workers are subjected to hard work. Furthermore, in order to take out a pile of 50 plates, a cardboard sheet must be inserted beforehand to the pile every 50 printing plates when the plates are piled, which leads to an increase of production costs.

The third problem relates to the second problem. The printing plates, the number of which is 700 to 1500, are conveyed in a stack to the plate processing machine by a fork lift. But human power is needed when the printing plates are fed to the plate processing machine. For that reason, the printing plates cannot be conveyed smoothly by the above-mentioned plate handling system.

The fourth problem is that unless the end plates 2, 2 are clamped firmly, some printing plates slip during conveyance and the surfaces of the presensitized lithographic resin layer tend to be easily damaged. When the end plates are strongly clamped by the bolts, but small foreign particles are between the plates, the surfaces of the resin layers are apt to be damaged as the interlief is not used between the printing plates. Even before the end plates are clamped, the lower printing plates of the pile are easily damaged because of the weight of the upper printing plates.

SUMMARY OF THE INVENTION

The principal object of the present invention is to provide an apparatus for conveying presensitized lithographic printing plates, the details of which will be explained as follows: The apparatus for conveying the printing plates occupies a small area; its working efficiency is very high as the conveyed printing plates can be taken out from the apparatus one by one; and the apparatus causes almost no damage on the surfaces of the printing plates during conveyance.

The above-mentioned object can be attained by setting a pile of presensitized lithographic printing plates with photosensitive resin on their supports between the two end plates, fixing the printing plate pile by clamping the end plates with bolts, and mounting the pile vertically on a portable stand.

In the present invention, the presensitized lithographic printing plates are mounted on the stand with interleaves between the plates or directly on the stand without interleaves. According to the investigation conducted by the inventors, it takes about 3 hours to insert interleaves between 1000 presensitized lithographic printing plates, and about 3 hours to take out the plates from the pile and remove the interleaves. Therefore, it needs about 6 hours in total. Accordingly, when the interleaves are not used to set the printing plates between the end plates, working efficiency is much improved.

According to the present invention, when interleaves are not inserted between the printing plates, the presensitized lithographic printing plates are more or less vertically mounted on the stand with the bottom edges of the printing plates coming into contact with the stand by their own weight, so the printing plates scarcely slip. For that reason, damage on the surfaces of the printing plates can be prevented. Therefore, the printing plates hardly move even when the end plates are loosely tied, so damage on the surfaces is prevented. Furthermore, tying the end plates loosely enhances the damage prevention effect when foreign particles intrude between the printing plates.

Furthermore, although the printing plates vertically mounted on the stand are 1 m × 1 m, their thickness is 2 to 3 mm, so that when 1000 printing plates are piled up, the total thickness is 200 to 300 cm, and thus a small space is enough to mount them.

When the printing plates are conveyed close to the plate processing machine in the vertical condition, a worker can take out the printing plates as they are one by one and put them in the plate processing machine to process them. In this way, the working efficiency of conveying the printing plates and setting them in the plate processing machine is remarkably improved.

On the other hand, when the height of the portable stand is higher than the width of it, the stand is unstable and liable to overturn. There is a chance of overturning because the weight of the printing plate pile is heavy. The countermeasure will be explained as follows. In addition to the casters installed under the portable stand to convey the printing plates which are set in the vertical condition, other casters should be installed on the side of the portable stand. The casters are used to store the pile of the printing plates in the horizontal condition. Since the pile of the printing plates are laid down on their side as mentioned above, there is no possibility of overturning and the printing plates can be stored safely. When the printing plates are to be processed (when they are set close to the plate processing machine), the stand is to be raised to take out the printing plates easily from the stand and supply them to the plate processing machine smoothly.

As mentioned in the following example, the stand and the end plates are made of plywood at a reasonable cost. On the other hand, when plywood is used to make the stand and the end plate, whenever the presensitized lithograhic printing plates are set on the stand or taken out from the stand, dust comes out from the plywood. The dust scatters on the photosensitive surface of the presensitized lithographic printing plate and can damage the surface. Plywood is not so strong, so that portions which come into contact with the bolts and nuts are liable to be deformed. Even if a washer is set between the plywood and the nut, deformation can not be completely prevented. Furthermore, plywood lacks stiffness. Accordingly, the force applied by the end plates is not uniform. As a result, the tying force does not work all over the surfaces of the printing plates. Therefore, weak tying force can be a cause of slippage followed by damage of the printing plate surfaces. For that reason, when plywood is used as the end plates, thick plywood must be used, which is, of course, heavy.

In view of these facts, the stand and end plates are made from metals in a preferable example. As a result, the strength and stiffness of the stand and the end plates are improved and their deformation can be avoided. So, the presensitized lithographic printing plates can be tied uniformly and slips and damages of the printing plate surfaces can be prevented. Furthermore, there is no problem caused by dust which comes out when plywood is used. Another advantageous point is that when the end plates are made of metal frames and thin metal plates, the weight of the structure becomes light and it is easily conveyed. When the end plates are clamped by bolts, deformation of plates can be prevented and they can have a long life span, in other words, they are excellent in endurance.

BRIEF DESCRIPTION OF THE DRAWINGS

FIG. 2 is a perspective view. FIG. 3 is a side view. FIG. 4 is a perspective view of the main portion viewed from another direction.

DETAILED DESCRIPTION OF THE INVENTION

The details of the present invention will be explained as follows.

Figure 1:
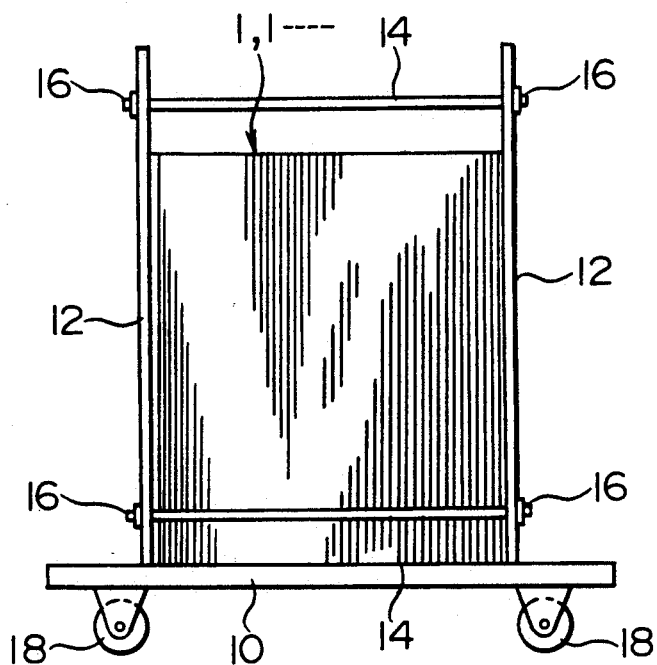
FIG. 1 is the front view of the first example of the present invention.

FIG. 1 shows the first example. The numeral 1 is a presensitized lithographic printing plate. The plates are vertically mounted on the stand 10 without interleaves between them or with interleaves. The presensitized lithographic printing plates 1, 1, . . . are equipped with the end plates 12, 12 on both sides. The end plates 12, 12 are clamped by the bolts and nuts 16 at peripheral positions where they do not interfere with printing plates 1. The support of the printing plate and the presensitized lithographic resin of the adjoining printing plate come into direct contact with each other. The printing plates are mounted on stand 10 in a body.

It is preferable that stand 10 is portable. It is most preferable that stand 10 can move on the floor with casters installed on the lower side of stand 10. When the end plates 12 are clamped by the bolts and nuts 16, it is preferable to clamp the bolts more loosely than by the conventional method of setting the printing plates horizontally. The reason is that clamping the bolts loosely is preferable to prevent the damage caused by foreign particles on the printing plate surface.

After the printing plates 1, 1 . . . are mounted on stand 10, the stand is conveyed close to the plate processing machine, which is not shown in the drawings, by casters 18 along the floor. When the stand is not equipped with casters, it is conveyed by a forklift. After that, when plate processing work is to be started, the bolts are loosened and the printing plates are taken out from the stand one by one to set the plates in the plate processing machine.

Figure 2:
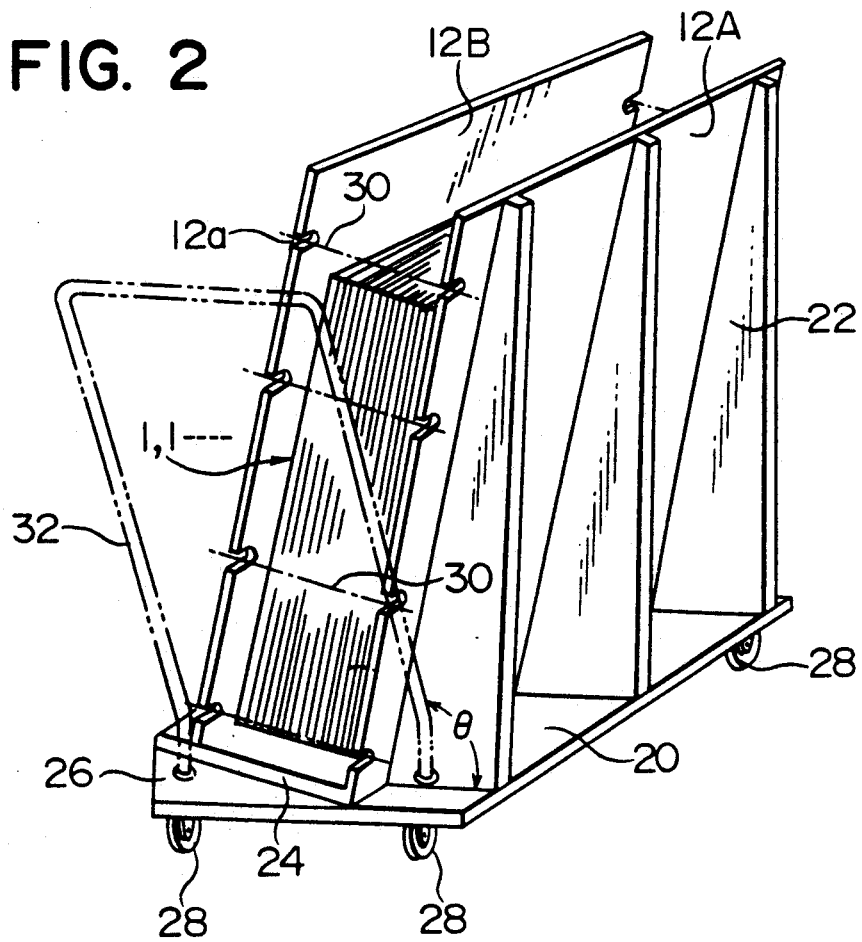
FIG. 2, FIG. 3, and FIG. 4 show the second example of the present invention.
Figure 3:
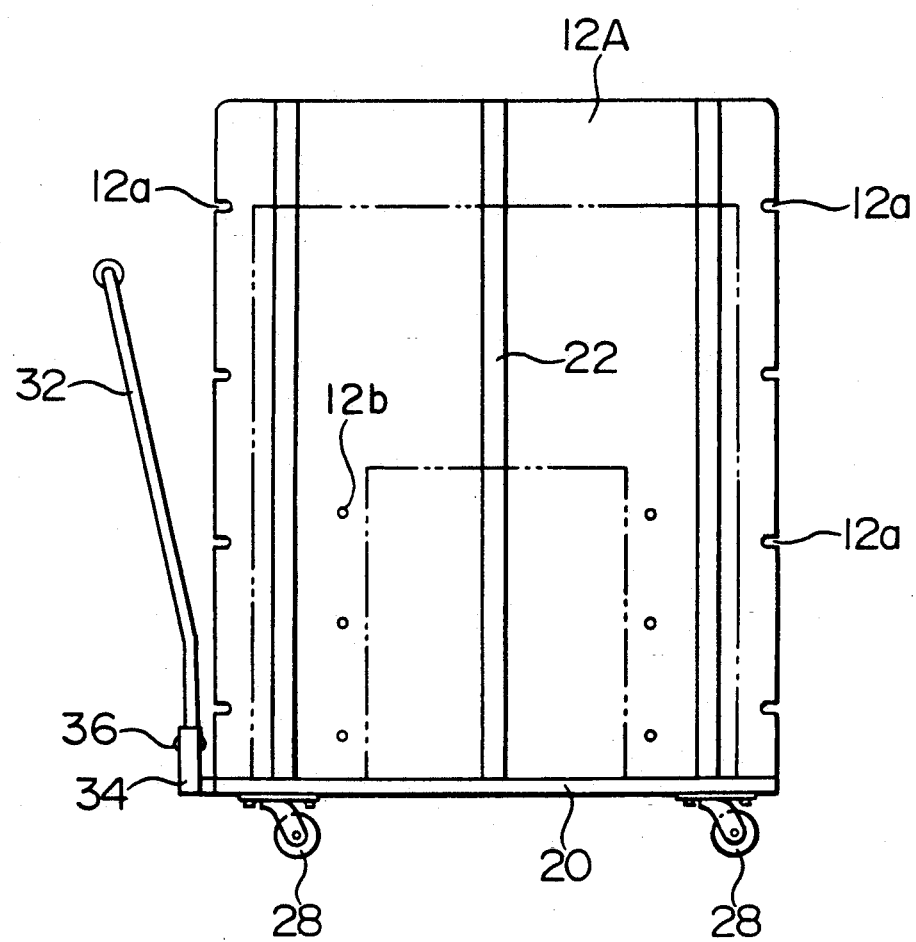
Figure 4:
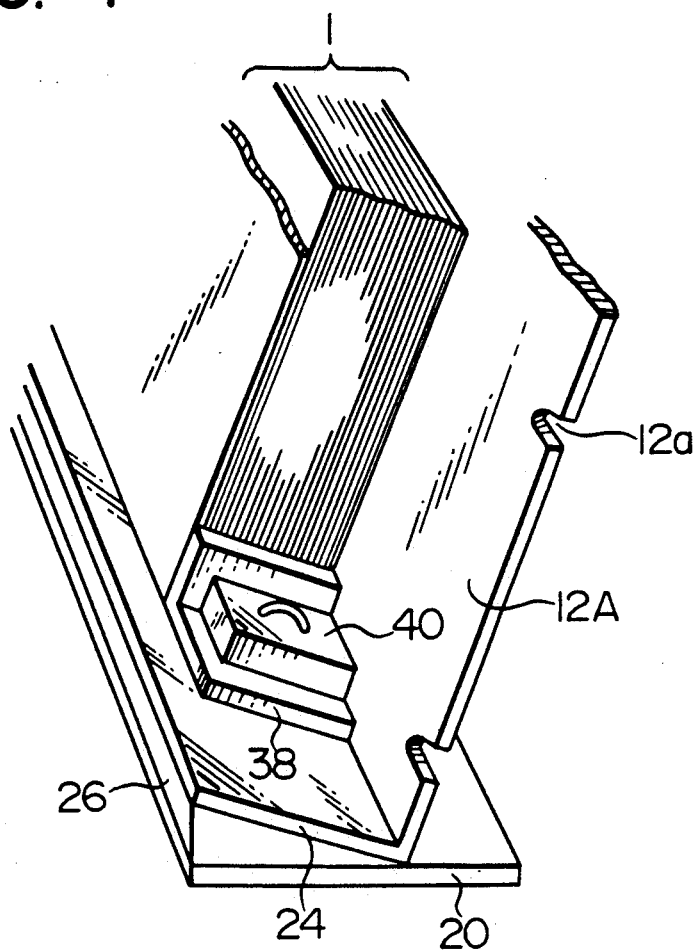

When the printing plates are taken out from the stand one by one, it is preferable to lean the printing plates against the inclined end plate 12A for the sake of stability and safety of the printing plates 1, 1 . . . as in the second example shown in FIG. 2, FIG. 3, and FIG. 4. In FIG. 2 to FIG. 4, the end plate 12A is mounted on the bottom plate 20 at an angle, and the end plate is reinforced by the reinforcing members 22. The bottom stand plate 24 is fixed to the bottom plate 20 by the spacer 26. A suitable number of casters 28 are mounted on the bottom plate 20. After a prescribed number of the printing plates 1, 1 . . . are leaned against the end plate 12A, the end plate 12B is set on the opposite side of the end plate 12A to come into contact with the surface of the printing plate 1. Then, the printing plates 1, 1 . . . are held by the end plates 12A and 12B by the bolts 30, 30 . . . which pass through notches 12a, 12a . . . made on the edges of the end plates 12A, 12B.

In order to move the apparatus close to the plate processing machine, the pushing handle 32 is installed as well as the above-mentioned casters 28. In case the handle 32 stands in the way when the apparatus is stored, it is preferable the handle 32 is set in the socket 34 which is fixed to the bottom plate 20 and the handle 32 is capable of quick connection and quick disconnection by setting and removing the pin 36 as shown in FIG. 3. The means of connection and disconnection is not limited to this example.

In FIG. 2 to FIG. 4, the printing plates 1, 1 . . . are piled, and leaned against the end plate 12A. After the end plates 12A and 12B are clamped by the bolts 30, an operator moves the apparatus to a prescribed place holding the handle 32. When the printing plates are to be taken out, the bolts 30 should be loosened and removed, and the end plate 12B is taken off. After that, the printing plates can be taken out from the opposite side of the inclined end plate 12A one by one. In this case, the printing plates 1 form an angle of $\theta$ with bottom plate 20 and rest against the end plate 12A. The end plate 12A preferably forms an angle of $\theta = 90°$ to 60° (except 90°) With the bottom plate 20. For that reason, the printing plates never fall out of the removal side. They are in a stable and safe position. Accordingly, the surface of the printing plates placed on the apparatus in this way never get damaged by rubbing.

A plurality of conveying apparatuses, the structure of which is shown in FIG. 2 to FIG. 4, can be prepared according to the printing plate sizes. As shown in FIG. 3 the bolt holes 12b can be made on the inner side of the end plates 12A. 12B for smaller printing plates. In this way, the apparatus for conveying the printing plates can be also applied to small size printing plates 1A.

When the printing plates 1, 1 . . . are leaned against the plate 12A, the L-shaped plate edge alignment member 38 can be installed as shown in FIG. 4. It is preferable to set the weight 40 on it in order to align positively the side edges of the printing plates 1, 1 . . .

Figure 5:
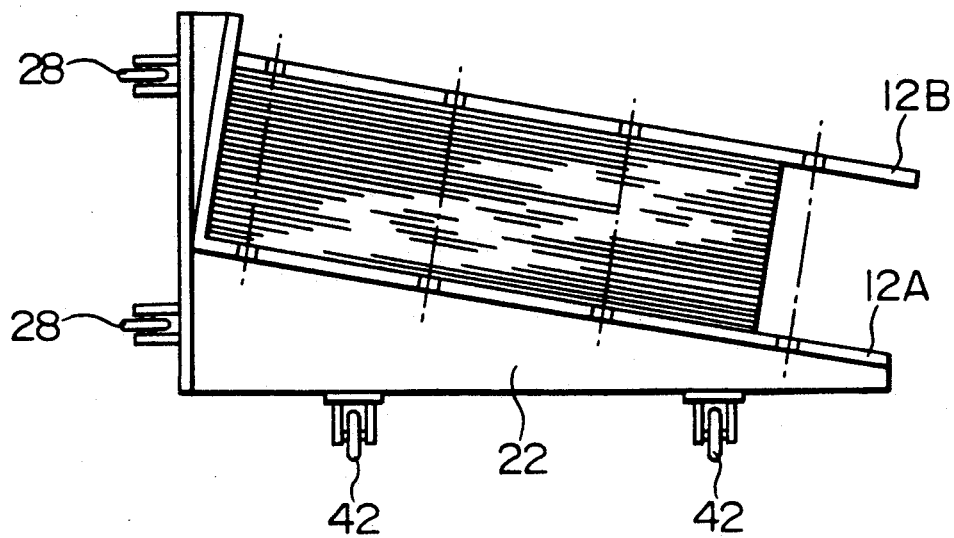
FIG. 5 is a front view of the third example in which the apparatus is set horizontally.

In the case the printing plates 1, 1 . . . are standing up as shown in FIG. 2 when they are stored, they occupy a small space, which is a point of advantage. On the contrary, when the printing plates are set vertically, they are liable to fall down when knocked. The is to install legs to hold the apparatus on the side, and preferably the casters 42, 42 . . . should be installed on the side as shown in FIG. 5. When the printing plates are stored, they are to be laid down on their surfaces as shown in the third example in FIG. 5. According to this method, the printing plates occupy a larger space, but compared with the area of the base, the height is low. For that reason, the apparatus loaded with the plates can be prevented from falling down. When the casters 42 are mounted on the apparatus, the printing plates can be conveyed to another place laid down horizontally.

As mentioned before, when plywood is used as the stand 10 or 20 and the plates 12, the cost is reasonable, but several problems occur.

Figure 6:
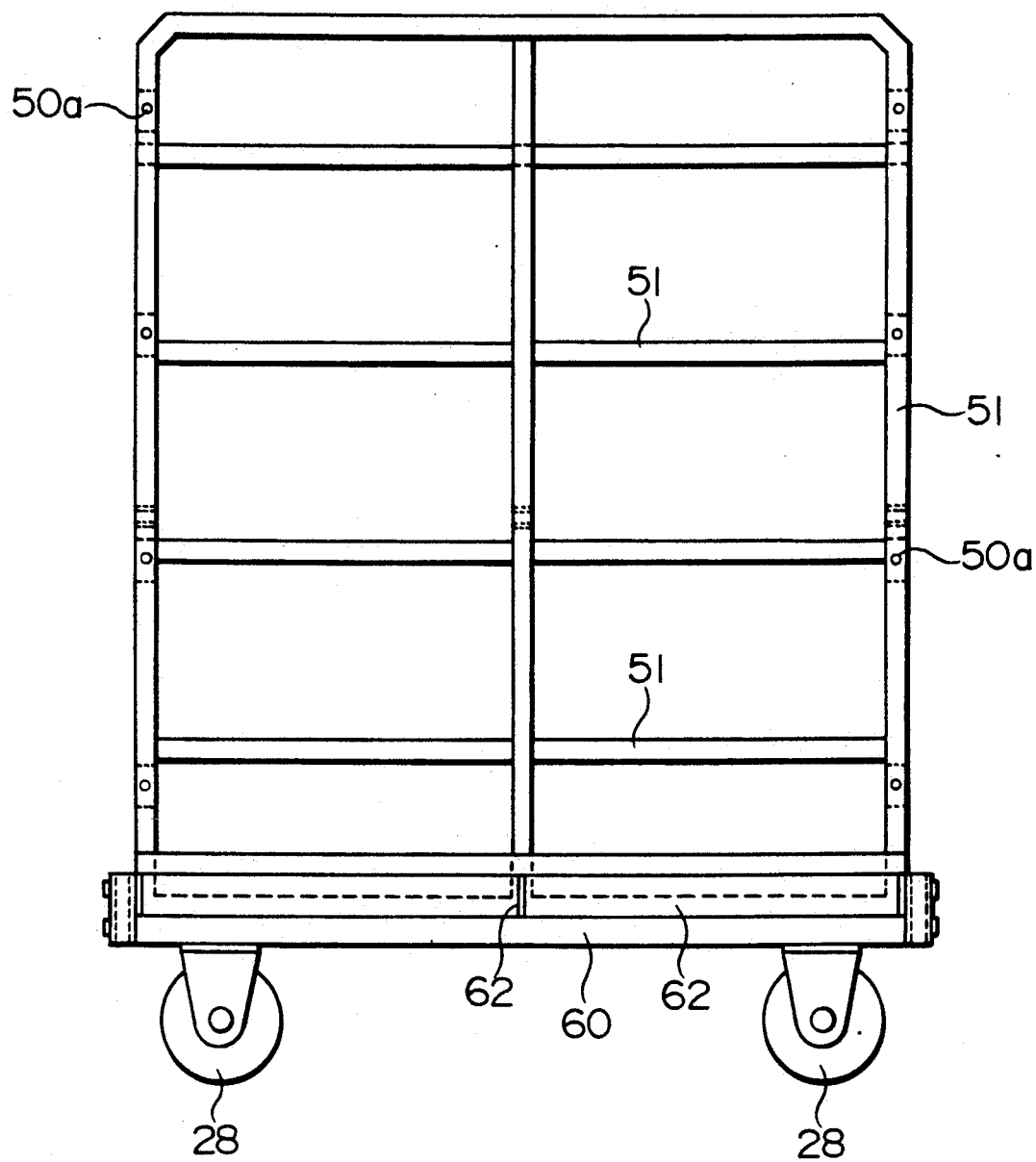
FIG. 6 is a front view of the fourth example.
Figure 7:
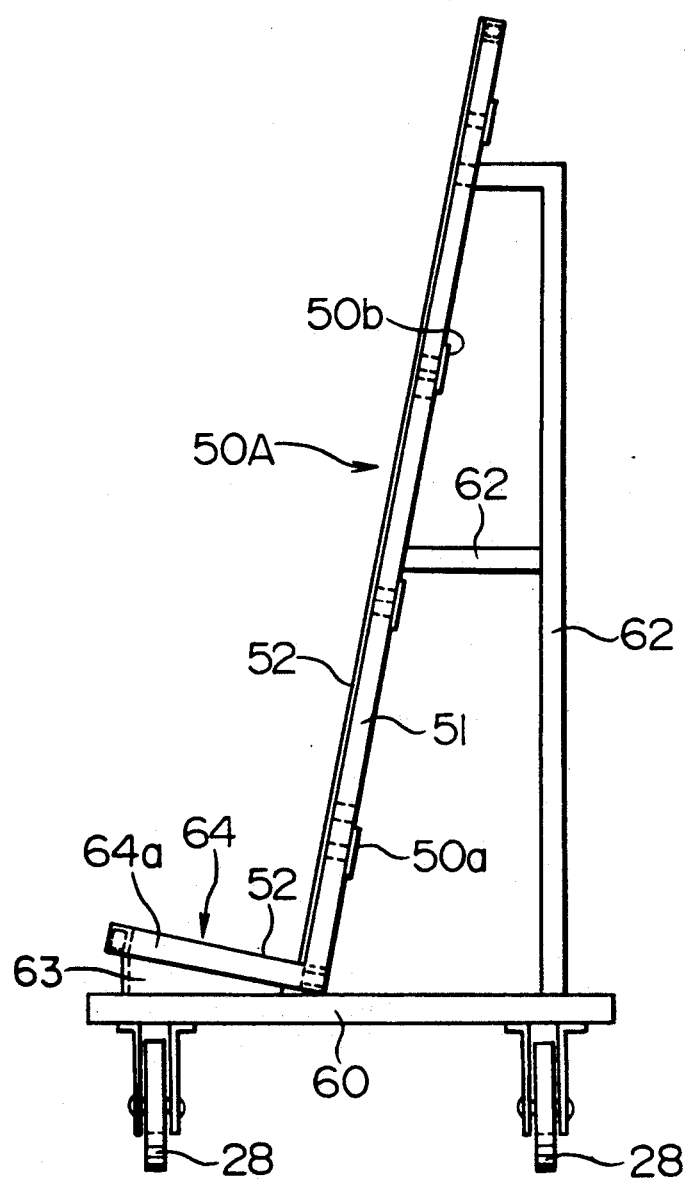
FIG. 7 is a side view of the fourth example.
Figure 8:
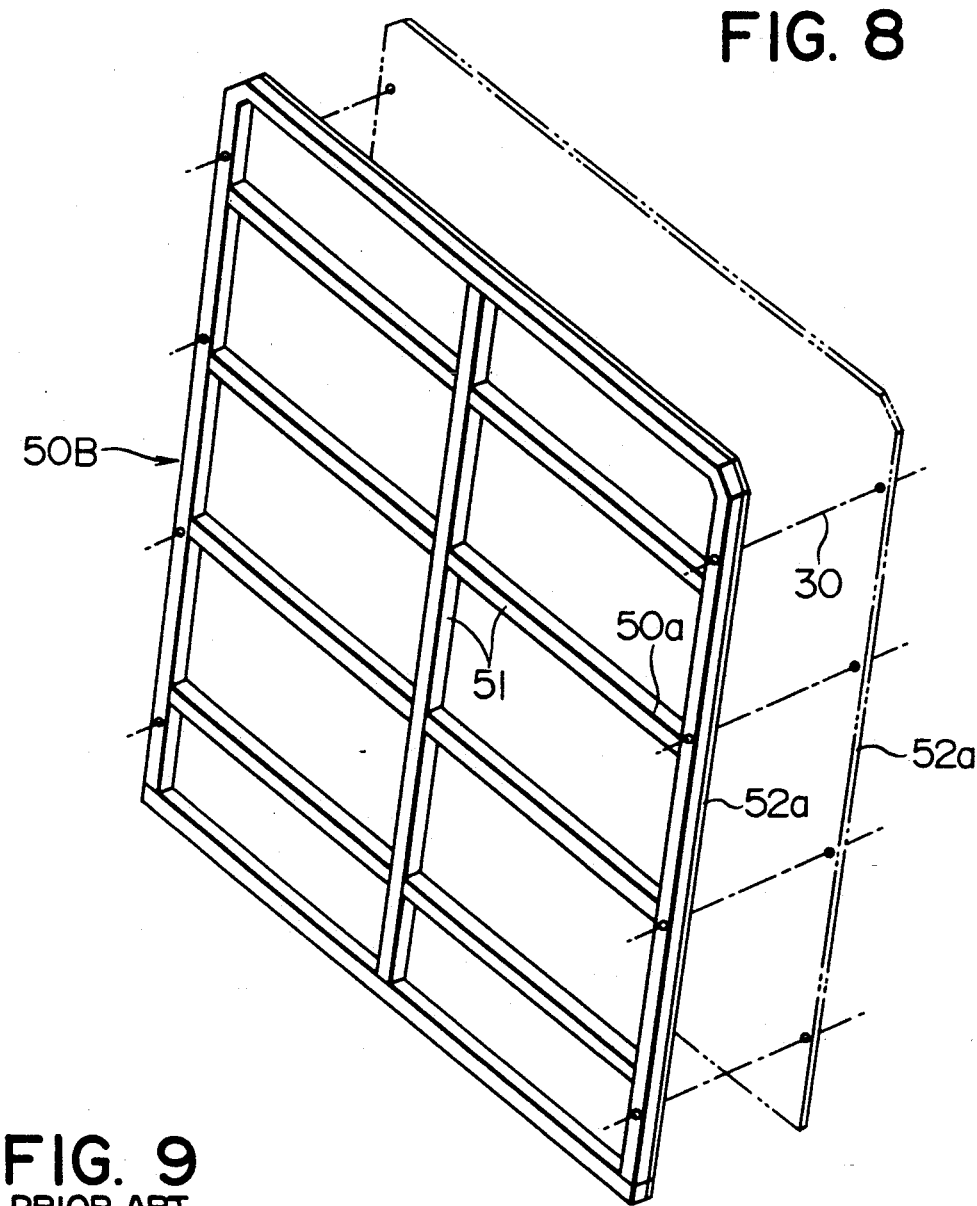
FIG. 8 is a perspective view of another side end plate.
Figure 9:
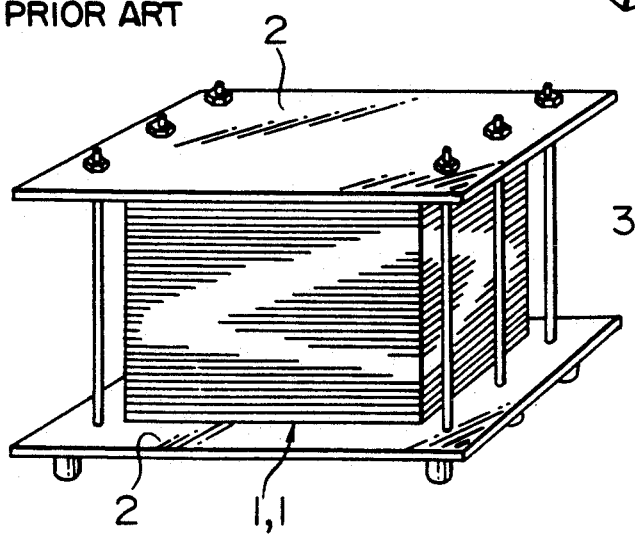
FIG. 9 is a perspective view of the conventional example.

As shown in the fourth examples in FIG. 6 to FIG. 8, the plates 12A, 12B, the bottom plate 20, and the bottom stand plate 24 can be replaced by the metal end plates 50A, 50B, the metal bottom plate 60, and the metal bottom stand plate 64.

The bottom plate 60 is made of combined angle bar and formed into a plane rectangle. The reinforcement member 62 is mounted on the bottom plate 60. For instance, this reinforcement member 62 is made of square steel and fixed to the bottom plate 60 by welding. The inclined end plate 50A and the inclined bottom plate 64 are made of the frame member 51 which is assembled from square steel and made of the surface plate 52 which is made of a thin stainless plate fixed to the surface formed by the frame member 51 by welding with which the printing plate 1 comes into contact. The numeral 63 is a spacer made of a steel plate.

The structure of the above-mentioned inclined end plate 50A will be explained in detail as follows. The inclined end plate 50A is formed by square steel into a lattice-like structure by welding. The surface plate 52 is fixed to it. The inclined bottom plate 64 is formed from the frame member 64a and the surface plate 52 in the same way.

The other end plate 50B is made of the frame member 51 which is assembled from square steel and the surface plate 52a which is made from plastics such as vinyl chloride. The reason why the surface plate is made from a plate is to reduce the weight, as the end plate 50B is frequently connected and disconnected.

In the fourth example, when the end plates 50A, 50B are tied by the bolts 30, a long bolt 30 is passed through the bolt holes 50a formed in the end plate 50A and 50B. The numeral 50b is a washer.

According to the fourth example, the problems mentioned before such as improvements in the strength of the stand and the end plate can be solved.

The variations of the fourth example are as follows. Metals in other shapes such as angle steel are used as the frame member. Metals other than steel bar are used as the frame member. The frame is not assembled by welding but by another method such as using metal fittings. The structure and shape of the frame are to be changed. The surface plate is eliminated.

In the present invention, the advantages are especially remarkable when not less than 100 printing plates, preferably not less than 300 printing plates are set on the stand of the apparatus for conveying presensitized lithographic printing plates.

The presensitized lithographic printing plate is generally obtained as follows. The photosensitive composition is coated on a support made from aluminum. It is exposed to active light such as ultraviolet rays through negatives. The portions which were exposed to light are polymerized or cross-linked to become insoluble to developer solution and the portions which were not exposed to light are removed by developer solution. The image portion repulses water and accepts oil ink, and the nonimage portion accepts water and repulses oil ink.

In this case, diazo resin which is the condensation of P-diazo diphenylamine and formaldehyde is widely used as the photosensitive composition especially in the negative type presensitized lithographic printing plate.

However, this diazo resin is seldom used alone. It is normally used at least together with a binder resin.

In the case of the positive type presensitized lithographic printing plate, quinonediazide compound is generally used.

Polymer having phenol OH group and carboxyl group such as novolak resin, polypalla hydroxy styrene, and styrene maleic acid copolymer anhydrate, is mainly used as the binder resin.

The photosensitive composition of light polymerization and light crosslinking can be used.

In any case, the printing plate made of an aluminum plate support on which the above-mentioned photosensitive resin is coated, is set vertically on the stand which was shown in the above-mentioned examples without interleaves or with interleaves, after a series of processes such as degreasing, sand outstanding, electro polishing, anodic oxidation, washing, and drying of the support, and futhermore coating photosensitive solution on the support, cutting of the printing plate, and surface inspection of the printing plate.

EXAMPLES

Examples will be explained below.

EXAMPLE 1

Presensitized lithographic printing plates were set on the stand of the apparatus for conveying the printing plates without putting interleaves between the printing plates coming into direct contact with each other. The number of damaged printing plates was investigated in two cases. One is the conventional printing plate conveying method in which the printing plates were set horizontally. The other is the present invention in which the printing plates were set vertically. The investigation was carried out on the following I and II of the presensitized lithographic printing plates. The conditions of the investigation were as follows.

Size and number of plates
1003×800×0.24 (mm)×1000 sheets
Clamping force of bolt
100 kgf·cm
Size of pallet
1200×1000 mm
Number of bolts
8
Kind of printing plate
I: Presensitized lithographic printing plate on which the photosensitive composition has been coated containing novolak resin and naphthoquinone-diazide compound
II: Presensitized lithographic printing plate on which the photosensitive composition has been coated containing copolymer of diazo resin and acrylic The number of damaged printing plates among 1000 sheets of the printing plates was shown in Table 1.

TABLE 1

| Kind of printing plate | Horizontal | Vertical |
|---|---|---|
| I | 12 sheets | 7 sheets |
| II | 9 sheets | 3 sheets |

According to the results of the test, it can be seen that the number of damaged printing plates in the case of the present invention is reduced to not more than 50% in comparison with the conventional horizontal type.

EXAMPLE 2

The same investigation as Example 1 was carried out in the case in which interleaves were put between the presensitized lithographic printing plates.

The result was no damage was recognized in both printing plates, I and II. The reason was that interleaves were used between the printing plates both in the case the printing plates were set horizontally and in the case the printing plates were set vertically.

According to the conventional method, first of all, 20 to 30 presensitized lithographic printing plates were taken out and leaned against a stand which is called the 'back of horse'. The interleaves set between the printing plates are taken off in this condition and the printing plates are to be conveyed to the plate processing machine. On the other hand, the printing plates are set vertically in the present invention. Accordingly, the working efficiency is increased. The inventors investigated the working efficiency per 1000 printing plates. In the case the printing plates were set horizontally in the conventional way, working time of 90 minutes and 2 workers were needed for the process of opening the packing, transfer, and conveyance. In the present invention, only 30 minutes and one worker were needed for the process of opening the package and conveyance the transfer process can be eliminated. In both cases, the time needed to take off the interleaves was omitted.

The following are the advantages of the present invention. Smaller spaces are needed to install the apparatus for conveying the presensitized lithographic printing plates. The working efficiency to conveyance and take out the printing plates is improved. The photosensitive resin surfaces are seldom damaged.

What is claimed is:

1. A method of packaging a pile of photosensitive printing plates on a carrier, said carrier including a base plate, a first end plate fixed to stand on said base plate, and a second end plate movable on said base plate, wherein each said first and second end plate has a surface large enough to substantially cover the entire surface of said printing plates, said method comprising;
   forming a pile of a plurality of printing plates, without inserting an interleaf between said printing plates;
   standing said printing plates on said base plate;
   leaning said printing plates toward said first end plate, said end plate being adapted to stand on said base plate with an angle $\theta$ to a horizontal line, whereby said printing plates are provided with said angle $\theta$, wherein said angle is 60° to less than 90°;
   sandwiching said printing plates between said first and second end plates by moving said second end plate toward said first end plate; and clamping said first and second end plates at least at an upper portion and a lower portion, to exert a compressive force on substantially the entire surface of said printing plates.

2. The method of claim 1 wherein more than 300 sheets of printing plates are piled without inserting an interleaf therebetween.

* * * * *